United States Patent [19]

Miller

[11] Patent Number: 4,734,656
[45] Date of Patent: Mar. 29, 1988

[54] MERGED INTEGRATED OSCILLATOR CIRCUIT

[75] Inventor: Ira Miller, Tempe, Ariz.

[73] Assignee: Motorola, Inc., Schaumburg, Ill.

[21] Appl. No.: 2

[22] Filed: Jan. 2, 1987

[51] Int. Cl.$^4$ ............................................. H03B 5/24
[52] U.S. Cl. ................................. 331/111; 331/108 D
[58] Field of Search .................. 331/111, 108 D, 143

[56] References Cited

U.S. PATENT DOCUMENTS

| | | | |
|---|---|---|---|
| 3,659,224 | 4/1972 | Ball | 331/111 |
| 3,886,485 | 5/1975 | Takahashi | 331/111 |
| 4,377,790 | 3/1983 | Zobel et al. | 331/111 |

Primary Examiner—Siegfried H. Grimm
Attorney, Agent, or Firm—Michael D. Bingham

[57] ABSTRACT

An oscillator is disclosed including a current mirror which is alternately enabled and disabled by a control signal and having an output and an input to which first and second currents are sourced and a capacitor which is coupled to the output of the current mirror. When the current mirror is enabled the capacitor is discharged through the current mirror to a first voltage level and is charged at substantially the same rate to a second voltage level when the current mirror is disabled. A merged two comparator structure having an input coupled to the output of the current mirror switches output level states at first and second outputs in response to the capacitor being charged and then discharged to said second and first voltage levels. A merged latch and load circuit coupled to the outputs of the merged two comparators is responsive to the output level states of the latter for providing said control signal to the input of the current mirror.

7 Claims, 2 Drawing Figures

MERGED INTEGRATED OSCILLATOR CIRCUIT

BACKGROUND OF THE INVENTION

The present invention relates to oscillators and, more particularly, to voltage controlled oscillators wherein a capacitor is charged and discharged between first and second voltage levels.

The prior art is replete with oscillators of the type to which the present invention is related. Typically, prior art oscillators of the type discussed herein require a pair of comparators having an output which switches output level states respectively as a capacitor, which is coupled to an input of the comparators, is charged and then discharged between first and second voltage levels. In addition, some type of latch circuit is generally required that is coupled to the outputs of the two comparators to produce a control signal in response to the output level states of the two comparators. The control signal drives a current circuit which sources current to charge the capacitor when disabled by the control signal and which sinks a current from the capacitor to discharge the same when enabled by the control signal.

Although prior art oscillators of the type discussed above work quite well they are not suited for all kinds of applications. In large and complex custom integrated circuit design it may be necessary to reduce die area required by these prior art types of oscillators in order to be able to reduce manufacturing costs while increasing circuit functions on the integrated chip.

Hence, a need exists for an improved oscillator that requires minimal die area using merged design techniques.

SUMMARY OF THE INVENTION

Accordingly, it is an object of the present invention to provide an improved oscillator.

It is another object of the present invention to provide an improved integrated oscillator circuit using merged design techniques.

Still another object of the present invention is to provide an oscillator having merged comparator circuitry in conjunction with merged load circuitry therefor.

In accordance with the above and other objects there is provided an oscillator for providing oscillatory signals at an output which comprises a current mirror which is alternately enabled and disabled by a control signal and having an output and an input to which first and second currents are sourced and a capacitor which is coupled to the output of the current mirror. When the current mirror is enabled the capacitor is discharged through the current mirror to a first voltage level and is charged at substantially the same rate to a second voltage level when the current mirror is disabled. A merged two comparator structure having an input coupled to the output of the current mirror switches output level states at first and second outputs in response to the capacitor being charged and then discharged to said second and first voltage levels and a merged latch and load circuit coupled to the outputs of the merged two comparators is response to the output level states of the latter for providing said control signal to the input of the current mirror.

DETAILED DESCRIPTION OF THE PREFERRED EMBODIMENT

Figure 1:
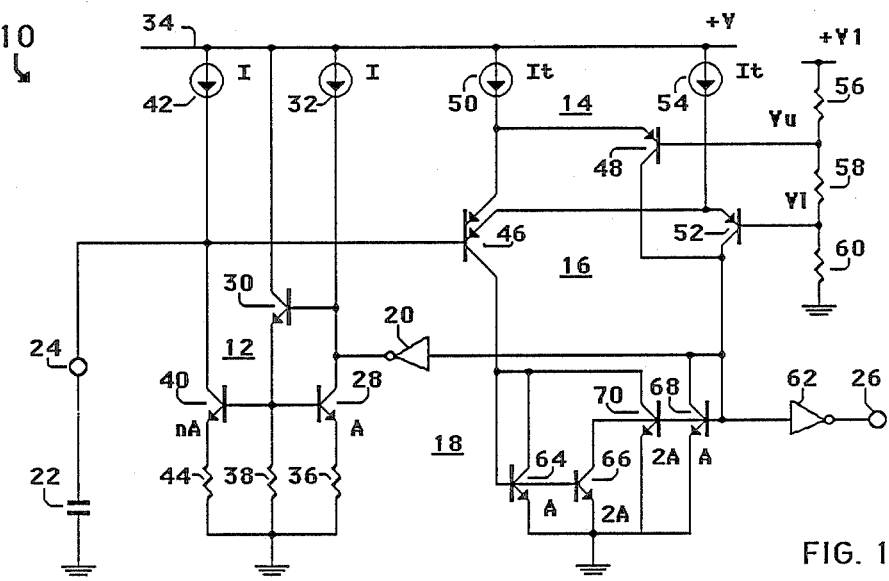
FIG. 1 is a schematic diagram of the oscillator of the present invention.

Turning to FIG. 1 there is shown oscillator 10 of the present invention which is suited to be fabricated in integrated circuit form. Oscillator 10 comprises current mirror 12, merged comparators 14 and 16 and latch circuit 18 which controls the operation of current mirror 12 via buffer inverter amplifier 20. An external capacitor is coupled at input terminal 24 to the output of current mirror 12 and is charged and discharged between an upper threshold and a lower threshold voltage, as will be explained, to produce a square wave output signal at output 26. Controlled current mirror 12 is generally known to those skilled in the art and consists of NPN transistor 28 connected as a diode by NPN transistor 30 which has its base and emitter connected between the collector and base of the former and its collector coupled to positive power supply conductor 34. The collector of transistor 28 is coupled at the input of the current mirror to constant current source 32. The emitter of transistor 28 is returned to ground via resistor 36 while the emitter of transistor 30 is returned to ground via resistor 38. Output NPN transistor 40 has its base coupled to the base of transistor 28 and its collector-emitter conduction path coupled between constant current source 42 and resistor 44. Current source 42 and resistor 44 are coupled to power supply conductor 34 and ground respectively. The output of current mirror 12 is coupled to terminal 24. As illustrated, the emitter of transistor 40 is area ratioed with respect to the emitter area of diode connected transistor 28 the emitter of the former being n times larger than the latter, where n is equal to a positive number. If, for example n is equal to 2 then when current mirror 12 is enabled transistor 28 will sink the current I from current source 32 which biases transistor 40 on wherein it will want to sink a current of 2I. Since current source 42 supplies only a current equal to I, transistor 40 will sink current from capacitor 22 equal to I. Capacitor 22 is therefore discharged at a rate proportional to I. When current mirror 12 is disabled the current I from current source 42 is sourced to capacitor 22 thereby charging the latter at a rate proportional to I.

Comparators 14 and 16 are formed of a merged structure including multi-emitter PNP transistor 46 the base of which is coupled at output 24 to capacitor 22 and whose collector forms a first output of the two comparators. A first emitter of transistor 46 is coupled with the emitter of PNP transistor 48 to constant current source 50 and functions as a first differential comparator circuit. The collector of transistor 48 is coupled to the second output of the two comparators and has its base coupled to the interconnection between resistors 56 and 58 at which is established an upper threshold voltage Vu. Constant current source 50 supplies the tail current It to differentially connected transistors 46 and 48. Similarly, the second emitter of transistor 46 is differentially coupled with the emitter of PNP transistor 52 to constant current source 54 which supplies the tail current It to the differential comparator formed thereby. The collector of transistor 52 is coupled to the second output of the two comparators and has its base coupled to the interconnection of resistors 58 and 60 at which is established a lower threshold voltage V1. Resistors 56, 58 and 60 are series coupled between positive voltage +V1 and ground. The output of oscillator 10 is illustrated as being taken from the collectors of transistors 48 and 52 via buffer inverter 62 to output 26. It is understood however that the output could also be taken from the collector of transistor 46.

A merged load and latch is provided to the outputs of the two comparators and includes NPN transistors 64, 66, 68 and 70 which are connected as dual current mirror active loads as will be explained. Transistor 64 is connected as a diode and has its collector shorted to its base and coupled to the collector of transistor 46. Transistor 66 forms a current mirror in conjunction with transistor 64 by having its base coupled to the collector/base of the latter. The emitters of transistors 64 and 66 are returned to ground while the collector of transistor 66 is coupled to the second output of the two merged comparators. As shown, the emitter area of transistor 66 is equal to two times the emitter area of transistor 64 and will, therefore, want to sink twice the current. Likewise, diode transistor 68 and transistor 70 form a current mirror with transistor 70 wanting to sink twice the current of transistor 68.

Figure 2:
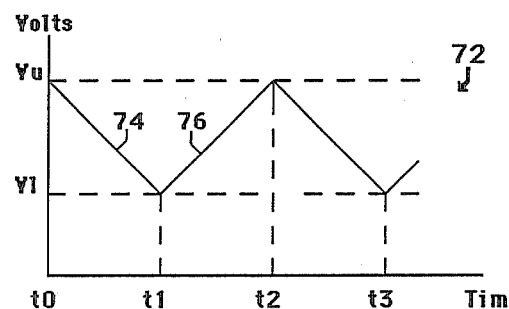
FIG. 2 is a waveform diagram useful for explaining the operation of the oscillator of FIG. 1.

Referring to FIG. 2, and in particular to waveform 72, the operation of oscillator 10 will now be explained. Assuming at time t0 capacitor 22 is charged to the threshold voltage level Vu, transistor 46 will be completely turned off as both emitters are reversed biased. In this condition transistors 48 and 52 are fully on such that a current equal to 2It is sourced to diode connected transistor 68. Transistor 70 will thus want to sink a current equal to 4It from the collector of non-conducting transistor 46 which causes the former to be in a saturated condition. Hence, the input to inverter 20 is near ground whereby the output therefrom is switched to a high level state to enable current mirror 12. When current mirror 12 is enabled transistor 28 will sink the current I from constant current source 32 to thereby turn on transistor 40. Transistor 40 will sink a current of 2I at the output of the current mirror. Because current source 42 can only supply a current I to transistor 40, capacitor 22 will be discharged at a rate proportional to I to supply the additional current required by the transistor. Capacitor 22 will continue to be discharged (waveform portion 74) until time t1 when the voltage thereacross has decreased to the lower threshold voltage V1. At this time the outputs of merged comparators 14 and 16 switch level states as transistor 46 is turned fully on since both emitters are now forward biased. Hence, transistors 48 and 52 are turned off and no current is supplied to diode connected transistor 68. However, transistor 46 now supplies a current equal to 2It which flows through transistor 64 to forward bias transistor 66. Transistor 66 becomes saturated as it wants to sink a current 4It from transistors 48 and 52. The output of latch circuit 18 will rise and be latched in this condition until such time that transistor 46 is once again turned fully off. In this condition the output of inverter 20 is switched to a low state which disables current mirror 12. When current mirror 12 is disabled current source 42 supplies the current I to capacitor 22 whereby the latter is charged at a rate proportional to this current (waveform portion 76) until t2 when the voltage developed thereacross reaches Vu. At this time transistor 46 is once again turned off thereby switching the output states of the merged comparators to latch circuit 18 into its other state wherein current mirror 12 is once again enabled to cause capacitor 22 to be discharged until time t3.

Hence, what has been described above is a novel oscillator circuit for producing oscillatory signals at an output which comprises a two comparator merged structure and a merged latch circuit coupled to the outputs of the two merged comparators which controls the operation of a current mirror to effect the charge and discharge of a capacitor.

I claim:

1. An oscillator for producing oscillatory output signals, comprising:

a current mirror circuit having an input and an output which is enabled and disabled accordingly in response to a control signal applied thereto for sinking first and second currents at said input and output respectively when enabled, said second current being greater than said first current;

constant current source means for providing first and second substantially equal currents at first and second outputs, said first and second outputs being coupled to said input and output respectively of said current mirror circuit;

charge storage means coupled to said output of said current mirror circuit, said charge storage means being charged and discharged between first and second voltage levels at substantially equal rates as said current mirror circuit is alternately disabled and enabled;

threshold voltage producing means for establishing a lower and an upper threshold voltage at first and second outputs;

merged comparing means having first, second and third inputs and first and second outputs, said first and second inputs being coupled respectively to said first and second outputs of said threshold voltage producing means, said third input being coupled to said output of said current mirror circuit, said comparing means being switched between first and second output level states in response to said charge storage means being charged and discharged between said first and second voltage levels; and latch load means coupled to said first and second outputs of said comparing means and being responsive to said comparing means for providing said control signal.

2. The oscillator of claim 1 wherein said merged comparing means includes:

a first transistor having first and second emitters, a collector and a base, said base being coupled to said third input, said collector being said first output;

a second transistor having an emitter, a collector and a base, said base being coupled to said first input, said collector being coupled to said second output and said emitter being coupled to said first emitter of said first transistor;

a third transistor having an emitter, a collector and a base, said base being coupled to said second input, said emitter being coupled to said second emitter of said first transistor and said collector being coupled to said second output; and current source means for supplying first and second current respectively to the first and second emitters of said first transistor.

3. The oscillator of claim 2 wherein said latch load means includes:
- a first current mirror having an input coupled to said first output of said comparing means and an output coupled to said second output of said comparing means; and
- a second current mirror having an input coupled to said second output of said comparing means and an output coupled to said first output of said comparing means.

4. The oscillator of claim 3 wherein said first current mirror includes:
- diode means coupled to said first output of said comparing means; and
- a transistor having a base coupled to said first output of said comparing means, an emitter coupled to a first power supply conductor and a collector coupled to said second output of said comparing means.

5. The oscillator of claim 4 wherein said second current mirror includes:
- diode means coupled to said second output of said comparing means; and
- a transistor having a base coupled to said second output of said comparing means, an emitter coupled to said first power supply conductor and a collector coupled to said first output of said comparing means.

6. The oscillator of claim 5 wherein said current mirror circuit includes:
- a diode coupled between said input of said current mirror circuit and said first power supply conductor; and
- a transistor having a base operatively coupled to said input of said current mirror circuit, an emitter coupled to said first power supply conductor and a collector coupled to said output of said current mirror circuit.

7. The oscillator of claim 6 wherein said latch load means includes circuit means for coupling said first output of said comparing means to said input of said current mirror circuit.

* * * * *